United States Patent [19]

Polak et al.

[11] Patent Number: 5,258,650

[45] Date of Patent: Nov. 2, 1993

[54] SEMICONDUCTOR DEVICE HAVING ENCAPSULATION COMPRISING OF A THIXOTROPIC FLUOROSILOXANE MATERIAL

[75] Inventors: Anthony J. Polak, Lake Zurich, Ill.; David J. Schifferle, East Aurora, N.Y.; Tom Wang, Northbrook, Ill.

[73] Assignee: Motorola, Inc., Schaumburg, Ill.

[21] Appl. No.: 749,756

[22] Filed: Aug. 26, 1991

[51] Int. Cl.$^5$ ............... H01L 23/28; H01L 23/02; H01L 23/12; H01B 17/00
[52] U.S. Cl. ................ 257/788; 257/687; 257/787; 257/798; 174/257; 174/258
[58] Field of Search ............ 357/81, 80, 72, 70, 357/74, 45; 361/397, 395, 402, 381, 386, 387; 257/687, 701, 787, 702, 788, 798; 174/257, 258

[56] References Cited

U.S. PATENT DOCUMENTS

| | | | |
|---|---|---|---|
| Re. 31,967 | 8/1985 | Burns | 357/70 |
| 4,063,993 | 12/1977 | Burns | 357/70 |
| 4,829,014 | 5/1989 | Yerman | 357/45 |
| 5,099,090 | 3/1992 | Allan et al. | 174/257 |

OTHER PUBLICATIONS

Cab-O-Sil Fumed Silica in Adhesives and Sealants Catalog.

*Primary Examiner*—Jerome Jackson
*Assistant Examiner*—Carl Whitehead, Jr.
*Attorney, Agent, or Firm*—Phillip H. Melamed; John H. Moore

[57] ABSTRACT

In a semiconductor device encapsulation assembly (50; 60), a semiconductor device (21), preferably a pressure transducer, is mounted on a base (11) in a cavity (20) formed by the base and surrounding walls (15). Electrical connections, preferably wire bonds (27), connect the semiconductor device to conductor paths (28) on the base within the cavity. An encapsulation material comprising a thixotropic fluorosiloxane material (51; 61) is applied in the cavity and completely covers the semiconductor device and the electrical connections. This structure enables the semiconductor device to withstand typical automotive contaminants, such as mild acids and gasoline, while also preventing erratic semiconductor device operation due to bubbles which may be drawn into the encapsulation material.

13 Claims, 2 Drawing Sheets

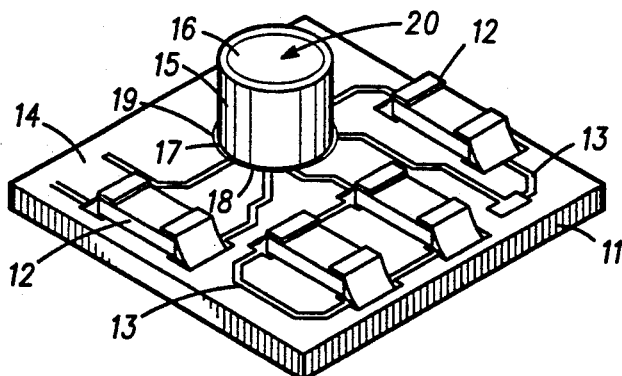
FIG. 1
— PRIOR ART —
FIG. 2
— PRIOR ART —
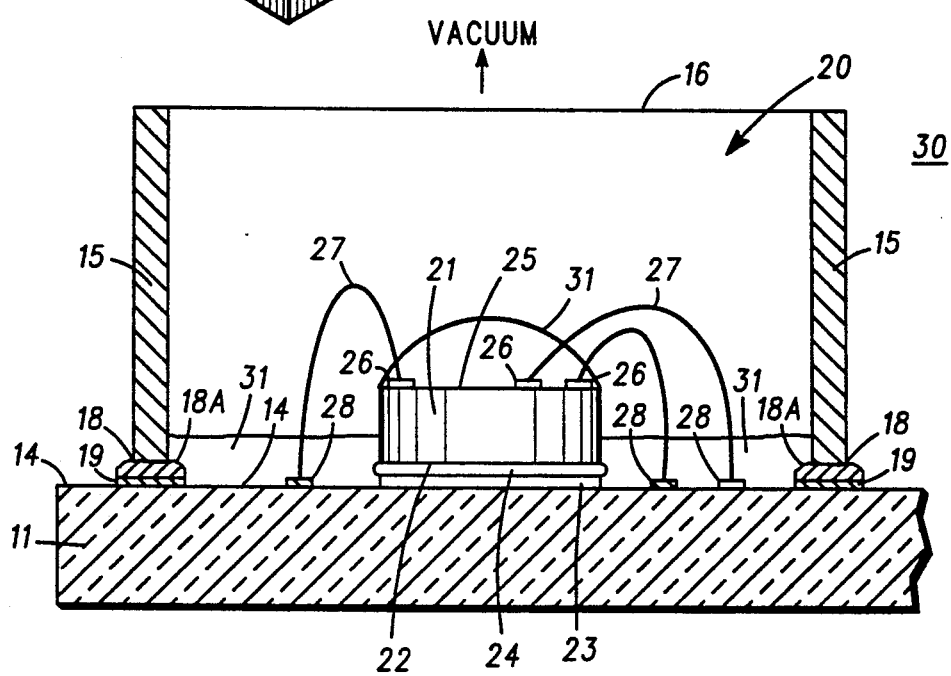
FIG. 3
— PRIOR ART —
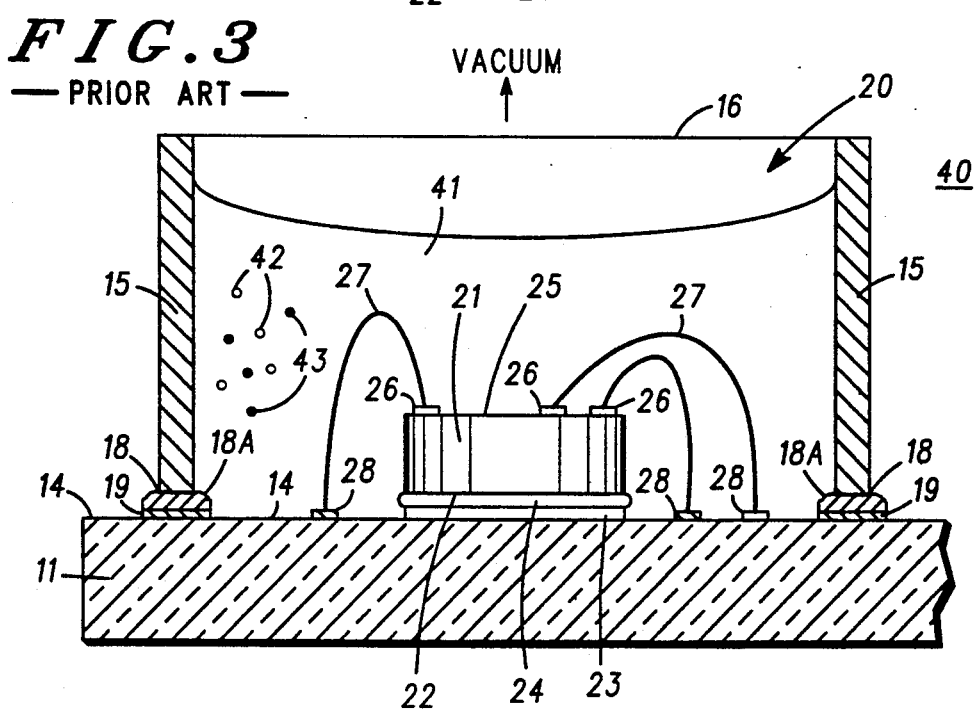

SEMICONDUCTOR DEVICE HAVING ENCAPSULATION COMPRISING OF A THIXOTROPIC FLUOROSILOXANE MATERIAL

FIELD OF THE INVENTION

The present invention relates to the field of semiconductor device encapsulation assemblies and methods for providing such assemblies. More particularly, the present invention has application to providing such assemblies for pressure transducer semiconductor devices.

BACKGROUND OF THE INVENTION

Prior pressure transducer assemblies exist in which a semiconductor pressure transducer die is mounted on a base substrate within a cavity to which vacuum pressure is to be applied. In such a prior configuration wire bonds are used to provide electrical connection between bonding pads on a top surface of the semiconductor pressure transducer die and conductor paths on the substrate.

In assemblies such as those described above, there is typically a substantial concern about contaminants affecting the operation of the pressure transducer by attacking the semiconductor chip metalization and/or the bonding wires or substrate conductor metalizations. For example, when the pressure transducer comprises an automobile pressure transducer used to measure manifold pressure, typically the entire assembly will be exposed to an atmosphere which may contain gasoline and mild acids as contaminants in the vacuum pressure to be measured by the transducer. These contaminants may also be external to the cavity in which the transducer is mounted wherein the external contaminants may seep into the cavity. Also, when the walls surrounding the pressure transducer are soldered to the base substrate on which the transducer is mounted, this can provide a source of other contaminants due to flux used in the soldering operation which was not completely removed and/or the presence of bubbles in the solder connection which will be drawn from the solder connection into the cavity during the application of vacuum pressure.

To provide some protection against all of these contaminants, one known prior art assembly shown in FIG. 2 has applied, as an encapsulation material, a conventionally available polyfluorosiloxane oligomer comprising Shin Etsu FE-53, which is available from Shin Etsu Silicone and comprises a polyfluorosiloxane gel. This material, when cured, has some resistance to attack by gasoline. Other types of known conventional die encapsulation materials, including known thixotropic die encapsulation materials, do not sufficiently resist attack by gasoline and were therefore found to be unsuitable for use in an automotive environment. Typically a drop of the uncured fluorosiloxane polymer (oligomer) is placed on the semiconductor die and then several additional drops are placed in the cavity in which the die is mounted. Then the oligomer is cured and the structure shown in FIG. 2 is the result. However, such a structure typically leaves portions of the semiconductor bonding wires exposed. This subjects these bonding wires to electrochemical attack (corrosion) by contaminants, and also these wires then provide a pathway for acids and contaminants to diffuse along the wires to the die surface where, in time, they attack the aluminum bonding pads on the die and cause the pressure transducer to fail.

A proposed solution to the above stated problems of the prior art assembly is shown in FIG. 3 in which the same conventional polyfluorosiloxane material is used to substantially fill the internal cavity in which the pressure transducer is mounted. However, this type of solution has resulted in a substantially different problem which also impairs the operation of the transducer. For the assembly shown in FIG. 3, when vacuum pressure is applied, bubbles and flux contaminants from the solder connection between the surrounding walls and the base substrate on which the semiconductor die is mounted will be drawn into the encapsulation material comprising the polyfluorosiloxane gel. These bubbles and contaminants are mobile in the encapsulation material and can travel to the bonding sites of the wire bonds on the top surface of the semiconductor die or the bonding sites on the conductor paths on the base substrate. These bubbles and contaminants can affect the operation of the pressure transducer such that erratic results may be obtained due to deterioration of the electrical connections to the die. The bubbles can also interfere with the pressure transducer properly measuring applied vacuum pressure since they will provide an erratic coupling of the vacuum pressure to be sensed to the top surface of the pressure transducer semiconductor die.

SUMMARY OF THE INVENTION

A semiconductor device encapsulation assembly is described herein for one embodiment of the present invention, and a method for providing such an assembly is described. The semiconductor device encapsulation assembly includes a protective outer structure having a base and surrounding walls which form an internal cavity that is open at one end and otherwise sealed. A plurality of conductor paths are provided within the cavity on the base and a semiconductor device is mounted in the cavity on the base. Electrical connections are provided between the semiconductor device and the plurality of conductor paths on the base wherein preferably these electrical connections comprise wire bonds. An encapsulation material, applied in an initial liquid form within the cavity, completely covers the semiconductor device and the electrical connections and this encapsulation material comprises a thixotropic fluorosiloxane material. By providing such a semiconductor device encapsulation assembly, the semiconductor device is less susceptible to erratic operation and attack by corrosive contaminants.

BRIEF DESCRIPTION OF THE DRAWINGS

The present invention can be better understood by reference to the drawings in which:

FIG. 1 is a perspective external view of a semiconductor encapsulation assembly;

FIG. 2 is a cross-sectional view of the assembly shown in FIG. 1 as provided in the prior art;

FIG. 3 is a cross-sectional view which illustrates a modification of the assembly shown in FIG. 2;

DESCRIPTION OF THE PREFERRED EMBODIMENT

Figure 4:
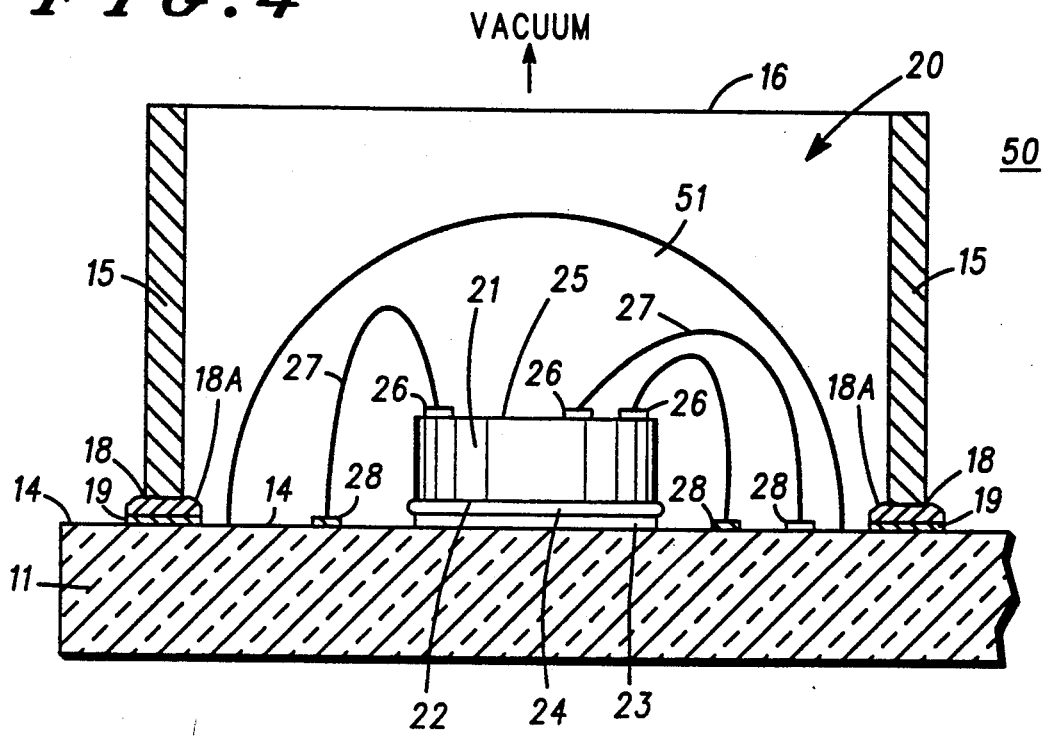
FIG. 4 is a cross-sectional view which illustrates an additional modification of the assembly shown in FIG. 2.

Referring to FIG. 1, a semiconductor device assembly 10 is illustrated which includes a ceramic substrate base 11 on which a plurality of electrical components 12 are provided and connected to each other via conductor paths, comprising metalizations 13, provided on a top surface 14 of the base 11. Annular walls 15 essentially form a protective cylinder having an open end 16 with an opposite end 17 closed by the top surface 14 of the base. The annular walls 15 are preferably mounted to the base 11 by soldering end portions 18 of these annular walls, via solder connections 18A (shown in FIGS. 2-5), to an annular metalization 19 provided on the top surface 14 of the base. The result is that the walls 15 and the base 11 form a protective outer structure having an internal cavity 20 therein which is open at the end 16 and otherwise hermetically sealed. Vacuum pressure is to be applied to this cavity 20 via the end 16. Some of the above noted features are also illustrated in cross-sectional FIGS. 2 through 5 as well as the external perspective view shown in FIG. 1.

Referring to the cross-sectional views in FIGS. 2 through 5, each of these illustrates a semiconductor device 21 which is mounted in the cavity 20 and on the base 11. A bottom surface 22 of the semiconductor die 21 is mounted to a metalization 23 on the base 11 located within the cavity 20 by some suitable bonding material 24 which may comprise solder, a polymer adhesive, or the conventional silicon gold eutectic formed in conventional die bonding operations. A top surface 25 of the semiconductor die 21 has a plurality of aluminum bonding pads 26 provided thereon. A plurality of gold wires 27 form a plurality of electrical connections between the bonding pads 26 and bonding sites 28 which comprise a plurality of conductor path metalizations provided on the top surface 14 of the base 11 within the cavity 20. It should be noted that all of the assemblies shown in cross-section in FIGS. 2 through 5 contain all of the same above described elements in substantially the same above described configuration. Also, to maintain the clarity of FIGS. 2-5, any encapsulation material shown therein is shown without cross hatching.

Preferably the semiconductor die 21 is a pressure transducer in which electrical signals related to sensed pressure are provided by the semiconductor device. Also, preferably the pressure transducer 21 is intended for use in automotive applications such as sensing engine manifold vacuum pressure. Thus there is a potential for contaminants such as gasoline or other corrosive acids to be present in the cavity 20. To protect against these contaminants attacking the bonding wires 27, the semiconductor die 21 and/or the bonding pads 26 or 28 and resulting in erratic or improper operation of the transducer 21, generally an encapsulation material has been provided in prior assemblies. One such prior assembly is shown in FIG. 2.

Referring to FIG. 2, a known prior art assembly 30 is illustrated in which an encapsulation material 31 is utilized. The encapsulation material comprises the fluorosiloxane oligomer Shin Etsu FE-53 which is commercially available in liquid form. The assembly 30 shown in FIG. 2 is created by placing a drop of the uncured polymer (oligomer) on top of the die 21 and placing several additional drops on the top surface 14 to provide the encapsulation material 31 as shown in FIG. 2. Then the assembly is cured which results in the assembly 30 shown in FIG. 2. While this structure does protect the bonding pads 26 on the semiconductor conductor die 21 while permitting transmission of vacuum pressure in the cavity 20 to the surface 25 of the die 21, portions of the gold bonding wires 27 are exposed and therefore subject to electrochemical attack by corrosive contaminants in the cavity 20. Because the exposed gold wires enter and exit the encapsulation material 31, they also provide a pathway for acids to diffuse along the wires to the die surface where, in time, they will attack the aluminum bonding pads 26 and cause the device to fail.

Referring now to FIG. 3, a variation of the prior art assembly 30 shown in FIG. 2 is illustrated as assembly 40. Assembly 40 directly corresponds to the prior art assembly shown in FIG. 2 except that now an encapsulation material 41, also comprising the same polyfluorosiloxane gel Shin Etsu FE-53 is now applied such that it substantially fills the cavity 20 and completely covers the bonding wires 27 and semiconductor die 21. Thus, clearly the assembly 40 shown in FIG. 3 would prevent the prior art problems caused by having some portions of the bonding wires 27 exposed. However, it has been found that the assembly 40 is subject to another substantial problem which prevents it from providing a reliable pressure transducer assembly.

Still referring to FIG. 3, during the application of vacuum pressure to the cavity 20 after the filling of the cavity with the encapsulation material 41, it has been found that bubbles 42 and contaminants 43 are drawn into the material 41 from the solder connections 18A between the end portions 18 of the walls 15 and the metalization 19 on the top surface 14 of the base 11. These contaminants 43 can result from flux which was trapped in the solder connection 18A but then released into the material 41 due to the application of the vacuum pressure and temperature cycling. Similarly, the bubbles 42 comprise air which was trapped in the solder connections 18A and then subsequently drawn into the material 41 during the application of vacuum pressure. The bubbles 42 and contaminants 43 are substantially mobile in the encapsulation material 41. The contaminants therefore can reach the bonding wires 27 and the bonding pads 26 and 28 and corrode these structures and the semiconductor die 21 with the result that the die may eventually fail. In addition, the bubbles 42 will also adversely affect the accuracy of the pressure transducer 21 since they form a variable coupling between the vacuum pressure in the cavity 20 and the top surface 25 of the semiconductor die 21.

Figure 5:
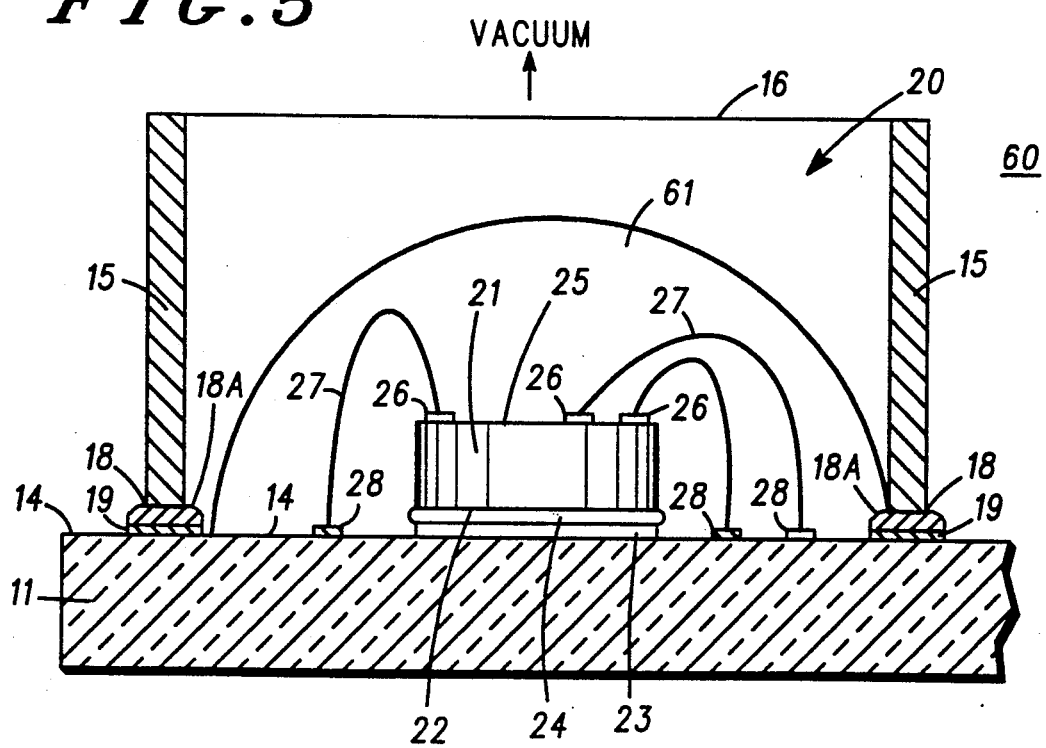
FIG. 5 is a cross-section view which illustrates a variation of the assembly shown in FIG. 4.

To overcome the above noted problems with regard to the assemblies 30 and 40 shown in FIGS. 2 and 3, improved assemblies 50 and 60 shown in FIGS. 4 and 5 have been provided. Again, the structure of the semiconductor die and its mounting within a cavity formed by the walls 15 is identical to that shown in FIGS. 2 and 3. However, now an encapsulation material 51 in FIG. 4 and 61 in FIG. 5 is provided wherein this encapsulation material is a thixotropic fluorosiloxane oligomer. The term "thixotropic" is readily known in the chemical field as comprising a material which exhibits a time dependent decreasing viscosity, or shear stress, at constant shear rate and returns to its "at rest" viscosity when the shear force is eliminated. Therefore this material will have a low viscosity when dispensed, in an initial liquid form, to ensure complete coverage, but immediately after dispensing it will have a high viscosity to ensure that it stays put and therefore would not run off the parts on which it is dispensed. Then the material will be cured so that it substantially retains its shape and becomes a cured polymer gel.

Preferably this thixotropic fluorosiloxane oligomer is obtained by mixing a fluorosiloxane oligomer, such as Shin Etsu X-36-3002, with fumed silica. When these components are mixed in an approximately 100 to 2 to 4 (100:2-4) ratio by weight with regard to the percentage of polymer to fumed silica, a desirable thixotropic encapsulation material with proper rheological properties was obtained. This ratio was used for combining silica, obtained from Cabot Corporation, (specifically Cab-O-Sil TS-720), with Shin Etsu X-36-3002 fluorosiloxane. However, other fluorosiloxane polymers, such as Dow Corning 6679 or Shin Etsu FE-53, could also have their rheological properties modified by using this same silica. In addition, other silicas, such as Cab-O-Sil PTG and others could also be used to obtain similar results.

It has been found that the use of a thixotropic fluorosiloxane oligomer can result in the assemblies 50 or 60 as shown in FIGS. 4 and 5. In FIG. 4, the thixotropic encapsulation material 51 has been applied and cured such that it completely covers the die 21 and wires 27 and it is disposed within the walls 15 without contacting these walls. This structure therefore eliminates the problems of contaminants and air bubbles from the solder connections 18A being drawn into the cavity 20 during the application of vacuum pressure to the cavity 20. This is because these air bubbles and contaminants will not enter the encapsulation material 51 because that material does not contact the solder connections 18A.

Referring to FIG. 5, a variation of the assembly 50 shown in FIG. 4 is illustrated by the assembly 60. The material 61 shown in FIG. 5 is the same thixotropic polyfluorosiloxane material as described above. Again the material 61 completely covers the die 21 and wires 27. However, now FIG. 5 illustrates that this material does contact at least one of the solder connections 18A. It has been found that even this type of configuration is acceptable since bubbles and contaminants which may enter the thixotropic encapsulation material 61 are not mobile enough to travel in this thixotropic material to the semiconductor die 21 or the bonding pads 26 or 28. Thus, because a thixotropic material has been utilized which will completely cover the bonding wires 27 and the semiconductor die 21, an improved assembly has been provided even if the encapsulation material will contact the solder connections 18A.

It should be noted that there are no thixotropic fluorosiloxane materials available in the marketplace. While fluorosiloxane materials are utilized in a number of applications when resistance to acids and gasoline is desired, it has been found that a thixotropic fluorosiloxane material is substantially more resistant to swelling of the fluorosiloxane material in the presence of gasoline. Thus by the use of a thixotropic encapsulation material, the assemblies 50 and 60 are less susceptible to erratic operation because of swelling of the encapsulation material due to exposure to gasoline. Since a main function of the encapsulation material is not only to protect the mechanical integrity of the assembly and its electrical connections but also to pass vacuum pressure through the material to the surface of the die 21, additional tests have been conducted and it has been found that a thixotropic encapsulation material such as described above can accurately transmit vacuum pressure to the pressure transducer 21. Also, since bubbles and contaminants are not very mobile in this thixotropic encapsulation material, they will not reach the semiconductor die 21. Bubbles from the solder connections 18A, even if they enter the material 61, will essentially remain close to the solder connections 18A and therefore not form a substantial variable coupling of applied vacuum pressure to the surface 25.

The significance of the assembly 60 is that in case dispensing equipment is not accurately perfected such that the assembly 50 shown in FIG. 4 can be achieved, the fact that the encapsulation material may contact the solder connections 18A will not result in producing a defective semiconductor assembly. This is because the thixotropic nature of the encapsulation material will sufficiently impede movement of contaminants and bubbles drawn from the solder connections 18A such that these will not present any significant problem. Thus the only additional cost for providing the improved assemblies 50 or 60 would be the additional material cost for providing a nonconventional thixotropic polyfluorosiloxane material, and this is not a significant cost.

While there have been shown and described specific embodiments of this invention, further modifications and improvements will occur to those skilled in the art. All such modifications which retain the basic underlying principles disclosed and claimed herein are within the scope of this invention.

What is claimed is:

1. A semiconductor device encapsulation assembly comprising:
   a protective outer structure having a base and surrounding walls which form an internal cavity open at one end and otherwise sealed;
   a plurality of conductor paths provided within said cavity on said base;
   a semiconductor device mounted in said cavity on said base;
   means for electrically connecting said semiconductor device to said plurality of conductor paths, said cavity with said base, said surrounding walls, said conductor paths, said semiconductor device and said electrically connecting means forming a pre-existing assembly; and
   an encapsulation material, applied in initial liquid form within said cavity in said pre-existing assembly, which completely covers said semiconductor device and said electrical connection means, wherein said encapsulation material comprises a thixotropic fluorosiloxane material.

2. A semiconductor device encapsulation assembly according to claim 1 wherein said semiconductor device is a pressure sensor which senses vacuum pressure to be applied to said cavity.

3. A semiconductor device encapsulation assembly according to claim 2 wherein said surrounding walls are soldered to metalization on said base to form a hermetic seal.

4. A semiconductor device encapsulation assembly according to claim 1 wherein said electrical connecting means comprise a plurality of wires which extend from bonding pads on a top surface of said semiconductor device to said conductor paths on said base.

5. A semiconductor device encapsulation assembly according to claim 4 wherein said semiconductor device has a bottom surface mounted to and bonded to metalization on said base.

6. A semiconductor device encapsulation assembly according to claim 2 wherein said encapsulation material includes a silica.

7. A semiconductor device encapsulation assembly according to claim 6 wherein said encapsulation material includes a fumed silica.

8. A semiconductor device encapsulation assembly according to claim 7 wherein said encapsulation material comprises a mixture of said fluorosiloxane material and fumed silica in an approximate 100:2-4 ratio by weight.

9. A semiconductor device encapsulation assembly according to claim 7 wherein said encapsulation material comprises a polyfluorosiloxane.

10. A semiconductor device encapsulation assembly according to claim 9 wherein said encapsulation material comprises a polyfluorosiloxane gel.

11. A semiconductor device encapsulation assembly according to claim 1 wherein said encapsulation material is disposed within said walls and without contacting said walls.

12. A semiconductor device encapsulation assembly according to claim 3 wherein said encapsulation material is provided within said walls without contacting said hermetic solder connection between said walls and said base.

13. A semiconductor device encapsulation assembly according to claim 12 wherein said semiconductor device is a pressure transducer which senses said vacuum pressure to be applied to said cavity and wherein said encapsulation material comprises a mixture of fluorosiloxane and fumed silica.

* * * * *